(12) United States Patent
Wen

(10) Patent No.: US 6,664,836 B1
(45) Date of Patent: Dec. 16, 2003

(54) DYNAMIC PHASE SPLITTER CIRCUIT AND METHOD FOR LOW-NOISE AND SIMULTANEOUS PRODUCTION OF TRUE AND COMPLEMENT DYNAMIC LOGIC SIGNALS

(75) Inventor: Huajun Wen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/318,517

(22) Filed: Dec. 12, 2002

(51) Int. Cl.[7] ............................................... H03K 3/00
(52) U.S. Cl. ........................................ 327/259; 327/258
(58) Field of Search .................................. 327/231, 257, 327/295, 259, 250, 251, 252, 253, 258

(56) References Cited

U.S. PATENT DOCUMENTS 5,867,043 A * 2/1999 Kim ............................ 327/257
6,366,151 B1 * 4/2002 Nakamura .................... 327/281

* cited by examiner

*Primary Examiner*—Dinh T. Le
(74) *Attorney, Agent, or Firm*—CARR LLP; Robert M. Carwell

(57) ABSTRACT

A phase splitter circuit including a clock delay section, a signal converter section and a signal generator section. The clock delay section uses a clock signal to produce first and second delayed clock signals that are time delayed versions of the clock signal. The second delayed clock signal is delayed more than the first. The signal converter section converts a static logic signal to a dynamic logic signal dependent upon the clock signal and the first delayed clock signal. The signal generator section produces a pair of complementary dynamic logic output signals dependent upon the dynamic logic signal and the first and second delayed clock signals. One of the output signals has a logic value equal to that of the static logic signal during an evaluation phase of the clock signal. A method for generating a pair of complementary dynamic logic signals from a static logic signal.

21 Claims, 3 Drawing Sheets

DYNAMIC PHASE SPLITTER CIRCUIT AND METHOD FOR LOW-NOISE AND SIMULTANEOUS PRODUCTION OF TRUE AND COMPLEMENT DYNAMIC LOGIC SIGNALS

TECHNICAL FIELD

This invention relates generally to electronic circuits and, more particularly, to phase splitter circuits for generating true and complement logic signals from an input logic signal.

BACKGROUND OF THE INVENTION

Dynamic logic circuits are based on electrical charge storage and transfer. One or more circuit nodes are used to store electrical charge. The nodes are typically charged to one voltage level (i.e., precharged) during a precharge operation, and selectively charged (e.g., discharged) to another voltage level during a subsequent evaluation operation dependent upon one or more input signals. For example, nodes of dynamic logic circuits are commonly precharged to a high voltage level when a synchronizing clock signal is at one voltage level (e.g., a low voltage level), and selectively discharged to a low voltage level dependent upon input signals when the clock signal transitions to another voltage level (e.g., a high voltage level).

Dynamic logic circuits typically operate faster, and require less integrated circuit die areas, than similar static logic circuits. On the other hand, dynamic logic circuits are also more sensitive to noise, clock signal timing, signal race conditions, and semiconductor process variations. Due to their drawbacks, dynamic logic circuits are often relegated to highly-specialized hand-tuned circuits, typically those along critical timing paths.

Many different types of logic circuits (e.g., memory array circuits) require logic signals and their complements (i.e., "true" and complement signals). When only true signals are provided, the complement signals must be generated. Static logic signals transition between defined logic levels, and generating a complement of a static logic signal requires only a relatively simple inverter gate (i.e., inverter).

Dynamic logic signals, on the other hand, are valid only during an evaluation phase of a clock signal. Further, true and complement signals must typically be valid at substantially the same time during the evaluation phase for proper dynamic circuit operation. For these reasons, generating a complement of a dynamic logic signal typically requires a more sophisticated true/complement signal generator (i.e., a phase splitter circuit) producing true and corresponding complement dynamic logic signals that are valid at substantially the same time during an evaluation phase of a clock signal.

When a phase splitter requires different amounts of time to produce true and corresponding complement signals dependent upon their logic values, the longest amount of time must typically be allowed for availability of the true and complement signals. As a result, an upper performance limit of a logic circuit using the true and complement signals is reduced. For example, assume a phase splitter requires one amount of time to produce a logic '1' true signal and the corresponding logic '0' complement signal, and a longer amount of time to produce a logic '0' true signal and the corresponding logic '1' complement signal. A logic circuit using the true and complement signals must allow the longer amount of time for availability of the true and complement signals and, as a result, an upper performance limit of the logic circuit is reduced.

As mentioned above, dynamic logic circuits are more sensitive to noise than static logic circuits. In addition, noise signals on signal lines are capacitively coupled to charge storage nodes, and are additive.

It would thus be advantageous to have a phase splitter circuit that generates relatively little noise during operation, and produces true and complement dynamic logic signals that are valid at substantially the same time during an evaluation phase of a clock signal independent of their logic values.

SUMMARY OF THE INVENTION

A phase splitter circuit is disclosed including a clock delay section, a signal converter section and a signal generator section. The clock delay section receives a clock signal and produces a first delayed clock signal and a second delayed clock signal. The first and second delayed clock signals are time delayed versions of the received clock signal, and the second delayed clock signal is delayed in time to a greater extent than the first delayed clock signal.

The signal converter section receives a static logic signal, the clock signal and the first delayed clock signal, and converts the static logic signal to a dynamic logic signal dependent upon the clock signal and the first delayed clock signal. The signal generator section receives the dynamic logic signal, the first delayed clock signal and the second delayed clock signal, and produces a pair of complementary dynamic logic output signals dependent upon the dynamic logic signal, the first delayed clock signal, and the second delayed clock signal, wherein one of the complementary dynamic logic output signals has a logic value equal to that of the static logic signal during an evaluation phase of the clock signal. The phase splitter circuit produces the complementary dynamic logic output signals at substantially the same time, and generates relatively little noise during operation.

A method is described for generating a pair of complementary dynamic logic signals from a static logic signal. The method includes using the clock signal to produce the above described first and second delayed clock signals. The clock signal and the first delayed clock signal are used to convert the static logic signal to a dynamic logic signal. The dynamic logic signal, the first delayed clock signal and the second delayed clock signal are used to produce the pair of complementary dynamic logic signals, wherein one of the complementary dynamic logic signals has a logic value equal to that of the static logic signal during an evaluation phase of the clock signal.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
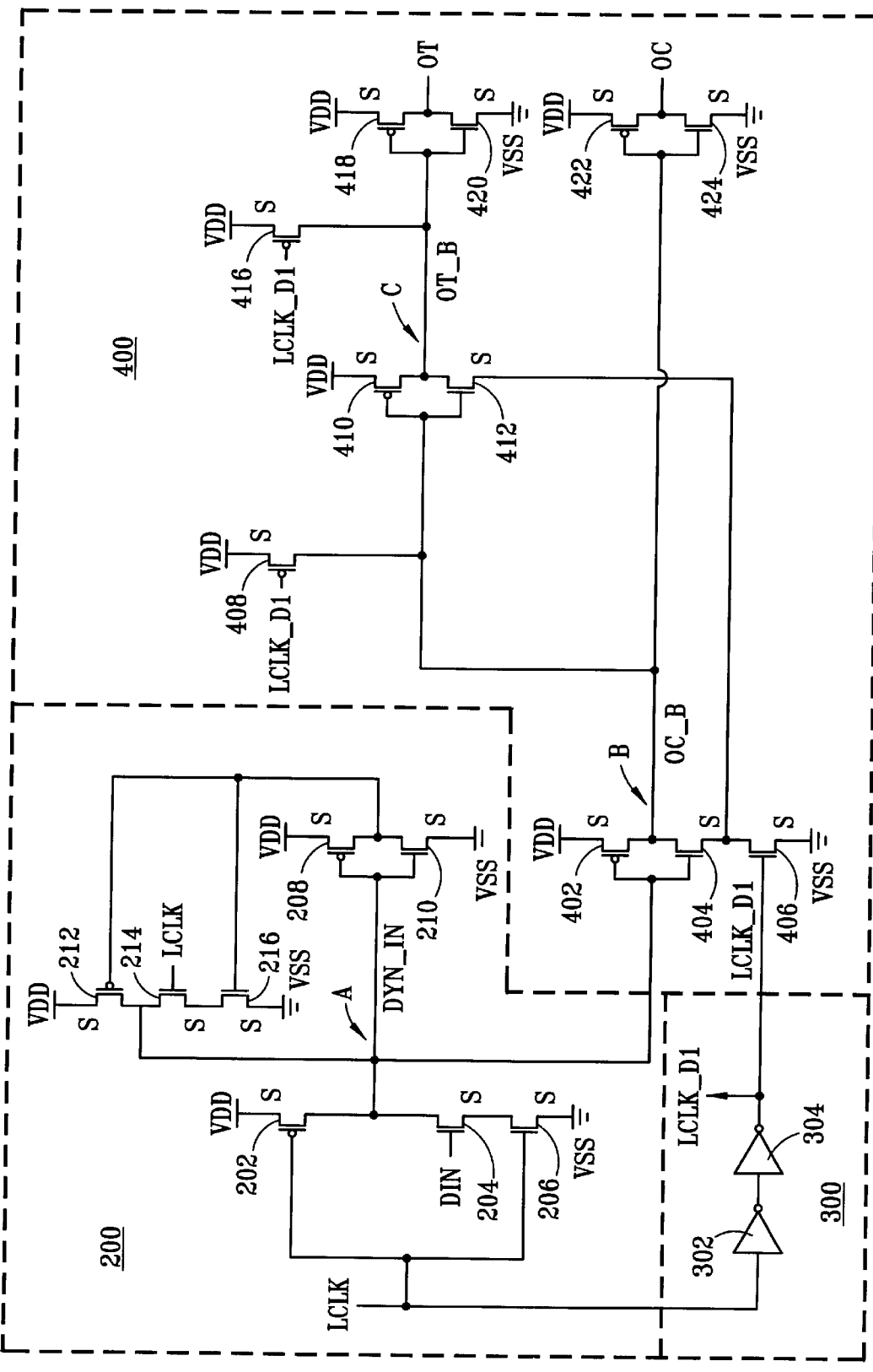
FIG. 1 is a diagram of one embodiment of a phase splitter circuit receiving a clock signal and a static logic signal and producing a pair of complementary dynamic logic signals, wherein one of the complementary dynamic logic signals has a logic value equal to that of the static logic signal during an evaluation phase of the clock signal.

FIG. 1 is a diagram of one embodiment of a phase splitter circuit 100. The phase splitter circuit 100 receives a clock signal 'LCLK' and a static logic signal 'DIN,' and produces dynamic logic signals 'OT' and 'OC.' In the embodiment of FIG. 1, the clock signal LCLK cycles between a low voltage range associated with a low logic level (e.g., a logic '0' level) and a high voltage range associated with a high logic level (e.g., a logic '1' level). The phase splitter circuit 100 includes several circuit nodes used to store electrical charge (i.e., dynamic nodes), and each cycle of the clock signal LCLK has a precharge phase and a subsequent evaluation phase. The dynamic nodes are charged (i.e., precharged) to a voltage within the high voltage range during the precharge phase of the clock signal LCLK (i.e., when the clock signal LCLK is low), and selectively discharged to a voltage within the low voltage range during the subsequent evaluation phase of the clock signal LCLK (i.e., when the clock signal LCLK is high).

In general, the dynamic logic signals OT and OC are valid only during the evaluation phase of the clock signal LCLK (i.e., when the clock signal LCLK is high). In the embodiment of FIG. 1, the dynamic logic signals OT and OC have low logic values (e.g., logic '0' values) during the precharge phase of the clock signal LCLK. During the evaluation phase of the clock signal LCLK, the dynamic logic signal OT has a logic value equal to that of the static logic signal DIN, and the dynamic logic signal OC has a logic value that is the complement of the logic value of the dynamic logic signal OT. In the embodiment of FIG. 1, the amount of time required to generate the dynamic logic signal OT when the dynamic logic signal OT is a logic '1' (and the dynamic logic signal OC remains a logic '0') is substantially equal to the amount of time required to generate the dynamic logic signal OC when the dynamic logic signal OC is a logic '1' (and the dynamic logic signal OT remains a logic '0'). In other words, the dynamic logic signals OT and OC are valid at substantially the same time during each evaluation phase of the clock signal LCLK (i.e., at substantially the same time after each rising edge transition of the clock signal LCLK) independent of their logic values.

In general, the static logic signal DIN is expectedly produced by a static logic gate. More specifically, the static logic signal DIN is expectedly produced at a node (i.e., a static node) driven by the static logic gate, and the static logic gate forms a low resistance path between the static node and one of two power supply voltage levels (e.g., $V_{DD}$ and $V_{SS}$) at all times during operation. The static logic signal DIN expectedly transitions between the logic '1' level and the logic '0' level at most once during each cycle of the clock signal LCLK. Between transitions, the static logic signal DIN expectedly remains in one of the two voltage ranges. The static logic signal DIN may be, for example, a data signal.

The phase splitter circuit 100 of FIG. 1 includes a signal converter section 200, a clock delay section 300 and a signal generator section 400. The signal converter section 200 receives the clock signal LCLK and the static logic signal DIN, and produces a dynamic logic signal 'DYN_IN' at a dynamic node 'A.' The dynamic logic signal DYN_IN is a dynamic version of the static logic signal DIN. In general, the dynamic logic signal DYN_IN is produced during the evaluation phase when the clock signal LCLK is high and is valid only during the evaluation phase.

An enhancement mode p-channel metal oxide semiconductor (PMOS) device 202, an enhancement mode n-channel metal oxide semiconductor (NMOS) device 204 and an NMOS device 206 of the signal converter section 200 form a dynamic logic gate driving the dynamic node 'A.' The PMOS device 202 is a precharge device. The PMOS device 202 receives the clock signal LCLK at a gate terminal and precharges the dynamic node A when the clock signal LCLK is low. The NMOS device 204 receives the static logic signal DIN at a gate terminal, and the NMOS device 206 receives the clock signal LCLK at a gate terminal. When the static logic signal DIN and the clock signal LCLK are both high, the dynamic node A is discharged through a low resistance path created through the NMOS device 204 and the NMOS device 206. Thus, the dynamic node A is selectively discharged during the evaluation phase of the clock signal LCLK dependent upon the static logic signal DIN.

It is noted that in other embodiments, the NMOS device 204 receiving the static logic signal DIN may be replaced by multiple NMOS devices, connected in series and/or parallel, and forming a pull-down network. Each of the multiple NMOS devices may receive a different input signal, and the dynamic logic gate may drive the dynamic node A according to a result of a logic function of the input signals realized by the pull-down network.

A PMOS device 208, an NMOS device 210 and a PMOS device 212 of the signal converter section 200 form a keeper circuit. The PMOS device 208 and the NMOS device 210 form a static inverter receiving the dynamic logic signal DYN_IN at the dynamic node A. The PMOS device 212 is a keeper device (e.g., a weak PMOS device). The PMOS device 212 receives an output of the static inverter at a gate terminal and charges the dynamic node A when the dynamic logic signal DYN_IN at dynamic node A is high and the output of the static inverter is low. Such keeper circuits are commonly used to compensate for charge losses at dynamic nodes due to charge sharing and leakage currents during low frequency clock operation.

An NMOS device 214 and an NMOS device 216 of the signal converter section 200 are optional and are included to reduce electrical power dissipation of the signal converter section 200. The NMOS device 214 receives the clock signal LCLK at a gate terminal, and the NMOS device 216 receives the output of the static inverter formed by the PMOS device 208 and the NMOS device 210 at a gate terminal. When the clock signal LCLK is high and the dynamic logic signal DYN_IN at node A is low, the output of the static inverter is high, and the dynamic node A is discharged through a low resistance path created through the NMOS device 214 and the NMOS device 216.

The clock delay section 300 receives the clock signal LCLK and uses the clock signal LCLK to produce another clock signal 'LCLK_D1' wherein the clock signal LCLK_D1 is a delayed version of the clock signal LCLK. In the embodiment of FIG. 1, the clock delay section 300 includes a first inverter 302 and a second inverter 304 connected in series to form a delay element. The first inverter 302 receives the clock signal LCLK and the second inverter 304 produces the clock signal LCLK_D1.

The signal generator section 400 receives the dynamic logic signal DYN_IN and the clock signal LCLK_D1 and uses the dynamic logic signal DYN_IN and the clock signal LCLK_D1 to produce the dynamic logic signals OT and OC. As described above, the signal generator section 400 produces the dynamic logic signals OT and OC at substantially the same time after each rising edge transition of the clock signal LCLK.

A PMOS device 402, an NMOS device 404 and an NMOS device 406 of the signal generator section 400 form a first dynamic inverter latch. The first dynamic inverter latch drives a dynamic node 'B,' and a dynamic logic signal 'OC_B' is produced at the dynamic node B. The PMOS device 402 receives the dynamic logic signal DYN_IN at a gate terminal and charges the dynamic node B when the dynamic logic signal DYN_IN is low. The NMOS device 404 receives the dynamic logic signal DYN_IN at a gate terminal, and the NMOS device 406 receives the clock signal LCLK_D1 at a gate terminal. When the dynamic logic signal DYN_IN and the clock signal LCLK_D1 are both high, the dynamic node B is discharged through a low resistance path created through the NMOS device 404 and the NMOS device 406. Thus, the dynamic node B is selectively discharged during an evaluation phase of the clock signal LCLK_D1 dependent upon the dynamic logic signal DYN_IN. It is also true that the dynamic node B is selectively discharged at a particular time during the evaluation phase of the clock signal LCLK dependent upon the dynamic logic signal DYN_IN.

The clock signal LCLK_D1, delayed in time with respect to the clock signal LCLK, is provided to the first dynamic inverter latch to avoid evaluating the dynamic logic signal DYN_IN while the dynamic logic signal DYN_IN is changing (i.e., transitioning from the high voltage range associated with the high logic level to the low voltage range associated with the low logic level).

A PMOS device 408 of the signal generator section 400 is a precharge device. The PMOS device 408 receives the clock signal LCLK_D1 at a gate terminal and precharges the dynamic node B when the clock signal LCLK_D1 is low (i.e., during the precharge phase of the clock signal LCLK_D1).

A PMOS device 410, an NMOS device 412 and the NMOS device 406 of the signal generator section 400 form a second dynamic inverter latch. The second dynamic inverter latch drives a dynamic node 'C,' and a dynamic logic signal 'OT_B' is produced at the dynamic node C. The PMOS device 410 receives the dynamic logic signal OC_B at a gate terminal and charges the dynamic node C when the dynamic logic signal OC_B is low. The NMOS device 412 receives the dynamic logic signal OC_B at a gate terminal and, as described above, the NMOS device 406 receives the clock signal LCLK_D1 at a gate terminal. When the dynamic logic signal OC_B and the clock signal LCLK_D1 are both high, the dynamic node C is discharged through a low resistance path created through the NMOS device 412 and the NMOS device 406. Thus, the dynamic node C is selectively discharged during the evaluation phase of the clock signal LCLK_D1 dependent upon the dynamic logic signal OC_B. It is also true that the dynamic node C is selectively discharged at a particular time during the evaluation phase of the clock signal LCLK dependent upon the dynamic logic signal OC_B.

A PMOS device 416 of the signal generator section 400 is a precharge device. The PMOS device 416 receives the clock signal LCLK_D1 at a gate terminal and precharges the dynamic node C when the clock signal LCLK_D1 is low (i.e., during the precharge phase of the clock signal LCLK_D1).

A PMOS device 418 and an NMOS device 420 of the signal generator section 400 form a static inverter. The static inverter receives the dynamic logic signal OT_B at the dynamic node C, and inverts the dynamic logic signal OT_B to produce the dynamic logic signal OT. In general, the dynamic logic signal OT has a logic value equal to that of the static logic signal DIN during each evaluation phase of the clock signal LCLK, and has a low logic value (e.g., a logic '0' value) during each precharge phase of the clock signal LCLK.

A PMOS device 422 and an NMOS device 424 of the signal generator section 400 form another static inverter. The static inverter receives the dynamic logic signal OC_B at the dynamic node C and inverts the dynamic logic signal OC_B to produce the dynamic logic signal OC. The dynamic logic signal OC has a logic value that is the complement of the dynamic logic signal OT during each evaluation phase of the clock signal LCLK and has a low logic value (e.g., a logic '0' value) during each precharge phase of the clock signal LCLK.

Figure 2:
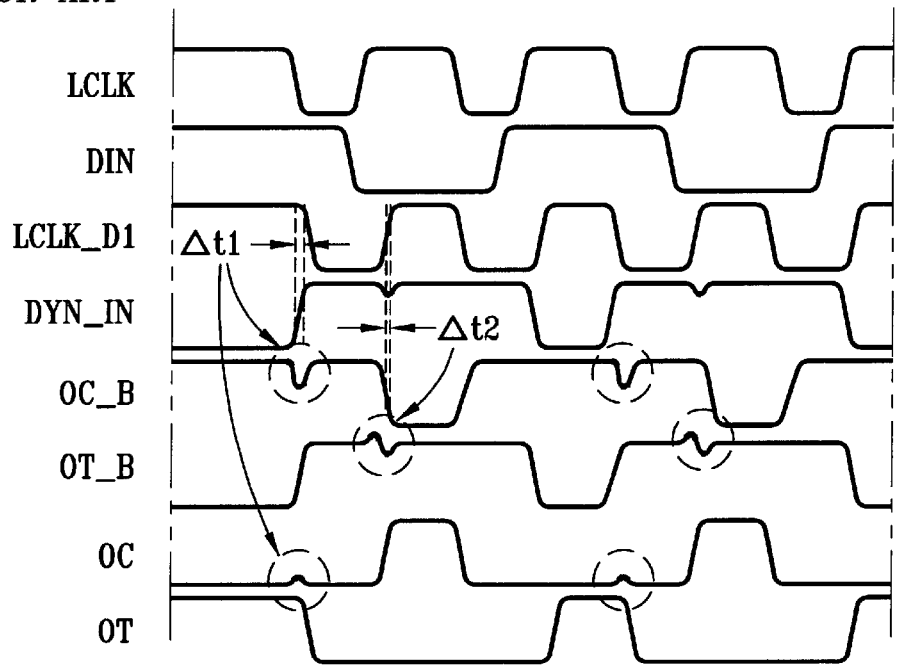
FIG. 2 is a timing diagram illustrating exemplary signal voltages within the phase splitter circuit of FIG. 1 versus time.

FIG. 2 is a timing diagram illustrating exemplary signal voltages within the phase splitter circuit 100 of FIG. 1 versus time. The signal voltages of FIG. 2 were produced via a computer simulation of the phase splitter circuit 100. The input clock signal LCLK and static logic signal DIN were selected to demonstrate certain characteristics of the phase splitter circuit 100.

FIG. 2 shows that the phase splitter circuit 100 of FIG. 1 produces the dynamic logic signals OT and OC at substantially the same time following rising edges of the clock signal LCLK as desired. Also, falling edges of the dynamic logic signal DYN_IN precede rising edges of the clock signal LCLK_D1, produced by delaying the clock signal LCLK, as desired.

However, FIG. 2 also shows that the phase splitter circuit 100 of FIG. 1 has logic hazards that produce glitches (i.e., unwanted deviations) in the dynamic logic signals OC_B, OT_B, and OC. For example, in FIG. 2, a rising edge of the dynamic logic signal DYN_IN precedes a falling edge of the clock signal LCLK_D1 by a time period $\Delta t1$, resulting in a relatively large glitch in the dynamic logic signal OC_B as indicated in FIG. 2. The glitch in the dynamic logic signal OC_B causes a corresponding glitch in the dynamic logic signal OC. In addition, a rising edge of the clock signal LCLK_D1 precedes a falling edge of the dynamic logic signal OC_B by a time period Δt2, resulting in a perturbation in the dynamic logic signal OT_B as indicated in FIG. 2.

The glitches in the dynamic logic signals OC_B, OT_B and OC are noise sources in the phase splitter circuit 100 of FIG. 1, and in any circuit including the phase splitter circuit 100. As mentioned above, dynamic logic circuits are more sensitive to noise voltages than static logic circuits, and noise signals are additive. The glitches in the dynamic logic signals OC_B, OT_B and OC not only increase the electrical power dissipation of the phase splitter circuit 100, they may also cause logic errors. It is thus highly desirable to eliminate, or at least substantially reduce, the glitches in the dynamic logic signals OC_B, OT_B and OC.

Figure 3:
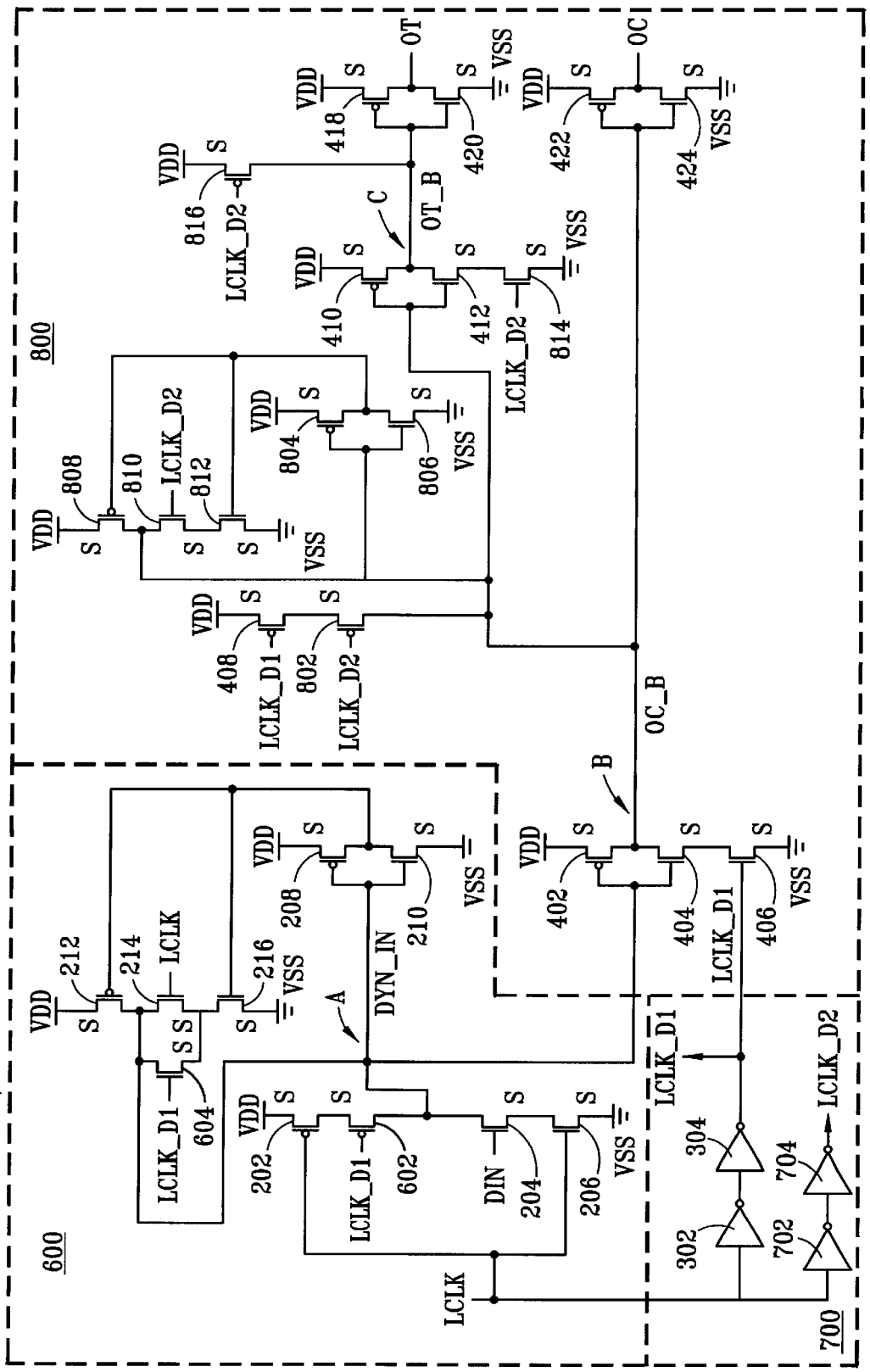
FIG. 3 is a diagram of a second embodiment of the phase splitter circuit of FIG. 1.

FIG. 3 is a diagram of a second embodiment of the phase splitter circuit 100 of FIG. 1 labeled 500 in FIG. 3. Like the phase splitter circuit 100 of FIG. 1, the phase splitter circuit 500 of FIG. 3 receives the clock signal LCLK and the static logic signal DIN and produces the dynamic logic signals OT and OC at substantially the same time during each evaluation phase of the clock signal LCLK independent of their logic values. In general, during the evaluation phase of each cycle of the clock signal LCLK, the dynamic logic signal OT has a logic value equal to that of the static logic signal DIN, and the dynamic logic signal OC has a logic value that is the complement of the logic value of the dynamic logic signal OT.

Like the phase splitter circuit 100 of FIG. 1, the phase splitter circuit 500 of FIG. 3 includes several circuit nodes used to store electrical charge (i.e., dynamic nodes). The dynamic nodes are charged (i.e., precharged) to a voltage within the high voltage range during a precharge phase of the clock signal LCLK, and selectively discharged to a voltage within the low voltage range during a subsequent evaluation phase of the clock signal LCLK. The precharge phase of the clock signal LCLK occurs when the clock signal LCLK is in the low voltage range associated with the low logic level (i.e., when the clock signal LCLK is low), and the evaluation phase of the clock signal LCLK occurs when the clock signal LCLK is in the high voltage range associated with the high logic level (i.e., when the clock signal LCLK is high). Thus, the dynamic nodes are precharged when the clock signal LCLK is low, and the dynamic logic signals OT and OC are produced at substantially the same time after each rising edge transition of the clock signal LCLK. In general, the dynamic logic signals OT and OC are valid only when the clock signal LCLK is high.

The phase splitter circuit 500 includes a signal converter section 600, a clock delay section 700 and a signal generator section 800. Many components of the signal converter section 600, the clock delay section 700 and the signal generator section 800 are similar to those of the respective signal converter section 200, clock delay section 300 and signal generator section 400 of the phase splitter circuit 100 of FIG. 1, and are labeled similarly in FIG. 3.

The signal converter section 600 of FIG. 3 receives the clock signal LCLK, the static logic signal DIN and the clock signal LCLK_D1, and produces the dynamic logic signal DYN_IN that is the dynamic version of the static logic signal DIN. In general, the dynamic logic signal DYN_IN is produced during the evaluation phase of the clock signal LCLK (i.e., when the clock signal LCLK is high), and is valid only during the evaluation phase of the clock signal LCLK (i.e., when the clock signal LCLK is high).

The PMOS device 202, a PMOS device 602, the NMOS device 204, and the NMOS device 206 of the signal converter section 600 form a dynamic logic gate driving the dynamic node A. The dynamic logic signal DYN_IN is produced at the dynamic node A. The PMOS device 202 and the PMOS device 602 form a precharge network. The PMOS device 202 receives the clock signal LCLK at a gate terminal, and the PMOS device 602 receives the clock signal LCLK_D1 at a gate terminal. The precharge network precharges the dynamic node A when the clock signal LCLK and the clock signal LCLK_D1 are both low.

As the clock signal LCLK_D1 is a delayed version of the clock signal LCLK, the added PMOS device 602 serves to delay the precharging of the dynamic node A (i.e., to delay the rising edges of the dynamic logic signal DYN_IN). Referring back to FIG. 2, the delaying of the rising edges of the dynamic logic signal DYN_IN reduces the time period Δt1 by which rising edges of the dynamic logic signal DYN_IN precede falling edges of the clock signal LCLK_D1. As a result, the relatively large glitches in the dynamic logic signal OC_B, and the associated smaller glitches in the dynamic logic signal OC, are significantly reduced. It is noted that the phase splitter circuit 500 of FIG. 3 can be configured to eliminate the time period Δt1 in FIG. 2 by which rising edges of the dynamic logic signal DYN_IN precede falling edges of the clock signal LCLK_D1.

Referring back to FIG. 3, just as in signal converter section 200 of FIG. 1, the NMOS device 204 receives the static logic signal DIN at a gate terminal, and the NMOS device 206 receives the clock signal LCLK at a gate terminal. When the static logic signal DIN and the clock signal LCLK are both high, the dynamic node A is discharged through a low resistance path created through the NMOS device 204 and the NMOS device 206. Thus, the dynamic node A is selectively discharged during the evaluation phase of the clock signal LCLK dependent upon the static logic signal DIN.

As noted above, in other embodiments, the NMOS device 204 receiving the static logic signal DIN may be replaced by multiple NMOS devices, connected in series and/or parallel, and forming a pull-down network. Each of the multiple NMOS devices may receive a different input signal, and the dynamic logic gate may drive the dynamic node A according to a result of a logic function of the input signals realized by the pull-down network.

Just as in the signal converter section 200 of FIG. 1, the PMOS device 208, the NMOS device 210 and the PMOS device 212 of the signal converter section 600 form the keeper circuit described above. The PMOS device 212 receives the output of the static inverter formed by the PMOS device 208 and the NMOS device 210 at a gate terminal, and charges the dynamic node A when the dynamic logic signal DYN_IN at the dynamic node A is high and the output of the static inverter is low.

The NMOS device 214, the NMOS device 216 and an NMOS device 604 of the signal converter section 600 are optional, and are included to reduce electrical power dissipation of the signal converter section 600. The NMOS device 214 and the NMOS device 604 are connected in parallel. The NMOS device 214 receives the clock signal LCLK at a gate terminal, and the NMOS device 604 receives the clock signal LCLK_D1 at a gate terminal. The NMOS device 216 receives the output of the static inverter formed by the PMOS device 208 and the NMOS device 210 at a gate terminal. When the dynamic logic signal DYN_IN at node A is low, the output of the static inverter is high. When the output of the static inverter is high and the clock signal LCLK is high, the dynamic node A is discharged through a low resistance path created through the NMOS device 214 and the NMOS device 216. When the output of the static inverter is high and the clock signal LCLK_D1 is high, the dynamic node A is discharged through a low resistance path created through the NMOS device 604 and the NMOS device 216.

The clock delay section 700 receives the clock signal LCLK and uses the clock signal LCLK to produce the clock signal LCLK_D1 and another clock signal 'LCLK_D2,' wherein the clock signals LCLK_D1 and LCLK_D2 are both delayed versions of the clock signal LCLK, and the clock signal LCLK_D2 is delayed in time by a greater amount than the clock signal LCLK_D1. In the embodiment of FIG. 3, the clock delay section 700 includes the first inverter 302 and the second inverter 304 connected in series to form a first delay element, and a third inverter 702 and a fourth inverter 704 are connected in series to form a second delay element. As described above, the first inverter 302 receives the clock signal LCLK and the second inverter 304 produces the clock signal LCLK_D1. The third inverter 702 receives the clock signal LCLK and the fourth inverter 704 produces the clock signal LCLK_D2.

The signal generator section 800 receives the dynamic logic signal DYN_IN, the clock signal LCLK_D1 and the clock signal LCLK_D2, and uses the dynamic logic signal DYN_IN and the clock signals LCLK_D1 and LCLK_D2 to produce the dynamic logic signals OT and OC. The signal generator section 800 produces the dynamic logic signals OT and OC at substantially the same time after rising edge transitions of the clock signal LCLK.

The PMOS device 402, the NMOS device 404 and the NMOS device 406 of the signal generator section 800 form the first dynamic inverter latch described above. The first dynamic inverter latch drives the dynamic node B, and the dynamic logic signal OC_B is produced at the dynamic node B. The PMOS device 402 receives the dynamic logic signal DYN_IN at the gate terminal and charges the dynamic node B when the dynamic logic signal DYN_IN is low. The NMOS device 404 receives the dynamic logic signal DYN_IN at the gate terminal, and the NMOS device 406 receives the clock signal LCLK_D1 at the gate terminal. When the dynamic logic signal DYN_IN and the clock signal LCLK_D1 are both high, the dynamic node B is discharged through the low resistance path created through the NMOS device 404 and the NMOS device 406. Thus, the dynamic node B is selectively discharged during an evaluation phase of the clock signal LCLK_D1 dependent upon the dynamic logic signal DYN_IN. It is also true that the dynamic node B is selectively discharged at a particular time during the evaluation phase of the clock signal LCLK dependent upon the dynamic logic signal DYN_IN.

As in the phase splitter 100 of FIG. 1, the clock signal LCLK_D1, delayed in time with respect to the clock signal LCLK, is provided to the first dynamic inverter latch to avoid evaluating the dynamic logic signal DYN_IN while the dynamic logic signal DYN_IN is changing (i.e., transitioning from the high voltage range associated with the high logic level to the low voltage range associated with the low voltage level).

The signal generator section 800 includes a PMOS device 802 connected in series with the PMOS device 408 to form a precharge network. The PMOS device 408 receives the clock signal LCLK_D1 at the gate terminal, and the PMOS device 802 receives the clock signal LCLK_D2 at a gate terminal. The dynamic node B is precharged when the clock signal LCLK_D1 and the clock signal LCLK_D2 are both low. As the clock signal LCLK_D2 is delayed in time to a greater extent than the clock signal LCLK_D1, the added PMOS device 802 serves to delay the precharging of the dynamic node B (i.e., to delay the rising edges of the dynamic logic signal OC_B).

A PMOS device 804, an NMOS device 806 and a PMOS device 808 of the signal converter section 200 form a keeper circuit. The PMOS device 804 and the NMOS device 806 form a static inverter receiving the dynamic logic signal OC_B at the dynamic node B. The PMOS device 808 is a keeper device (e.g., a weak PMOS device). The PMOS device 808 receives an output of the static inverter at a gate terminal and charges the dynamic node B when the dynamic logic signal OC_B at dynamic node B is high and the output of the static inverter is low.

An NMOS device 810 and an NMOS device 812 are optional and are included to reduce electrical power dissipation of the signal converter section 800. The NMOS device 810 receives the clock signal LCLK_D2 at a gate terminal, and the NMOS device 812 receives the output of the static inverter formed by the PMOS device 804 and the NMOS device 806 at a gate terminal. When the clock signal LCLK_D2 is high and the dynamic logic signal OC_B at node B is low, the output of the static inverter is high, and the dynamic node B is discharged through a low resistance path created through the NMOS device 810 and the NMOS device 812.

The PMOS device 410, the NMOS device 412 and an NMOS device 814 of the signal generator section 800 form a second dynamic inverter latch. The second dynamic inverter latch drives the dynamic node C, and the dynamic logic signal OT_B is produced at the dynamic node C. The PMOS device 410 receives the dynamic logic signal OC_B at the gate terminal, and charges the dynamic node C when the dynamic logic signal OC_B is low. The NMOS device 412 receives the dynamic logic signal OC_B at the gate terminal, and the NMOS device 814 receives the clock signal LCLK_D2 at a gate terminal. When the dynamic logic signal OC_B and the clock signal LCLK_D2 are both high, the dynamic node C is discharged through a low resistance path created through the NMOS device 412 and the NMOS device 814. Thus, the dynamic node C is selectively discharged during an evaluation phase of the clock signal LCLK_D2 dependent upon the dynamic logic signal OC_B. It is also true that the dynamic node C is selectively discharged at a particular time during the evaluation phase of the clock signal LCLK dependent upon the dynamic logic signal OC_B.

Referring back to FIG. 2, the perturbations in the dynamic logic signal OT_B are largely a result of a "false" evaluation of the dynamic logic signal OC_B at the second dynamic latch while the dynamic logic signal OC_B is changing (i.e., transitioning from the high voltage range associated with the high logic level to the low voltage range associated with the low voltage level). Providing the clock signal LCLK_D2 to the second dynamic latch as shown in FIG. 3, rather than the clock signal LCLK_D1 as shown in FIG. 1, serves to avoid this false evaluation and significantly reduces the glitches in the dynamic logic signal TO_B apparent in FIG. 2.

A PMOS device 816 of the signal generator section 800 is a precharge device. The PMOS device 816 receives the clock signal LCLK_D2 at a gate terminal and precharges the dynamic node C when the clock signal LCLK_D2 is low (i.e., during a precharge phase of the clock signal LCLK_D2).

The PMOS device 418 and the NMOS device 420 of the signal generator section 800 form a static inverter as described above. The static inverter receives the dynamic logic signal OT_B at the dynamic node C and inverts the dynamic logic signal OT_B to produce the dynamic logic signal OT. In general, the dynamic logic signal OT has a logic value equal to that of the static logic signal DIN during each evaluation phase of the clock signal LCLK and has a low logic value (e.g., a logic '0' value) during each precharge phase of the clock signal LCLK.

The PMOS device 422 and the NMOS device 424 of the signal generator section 800 form another static inverter. The static inverter receives the dynamic logic signal OC_B at the dynamic node C and inverts the dynamic logic signal OC_B to produce the dynamic logic signal OC. In general, the dynamic logic signal OC has a logic value that is the complement of the dynamic logic signal OT during each evaluation phase of the clock signal LCLK and has a low logic value (e.g., a logic '0' value) during each precharge phase of the clock signal LCLK.

Figure 4:
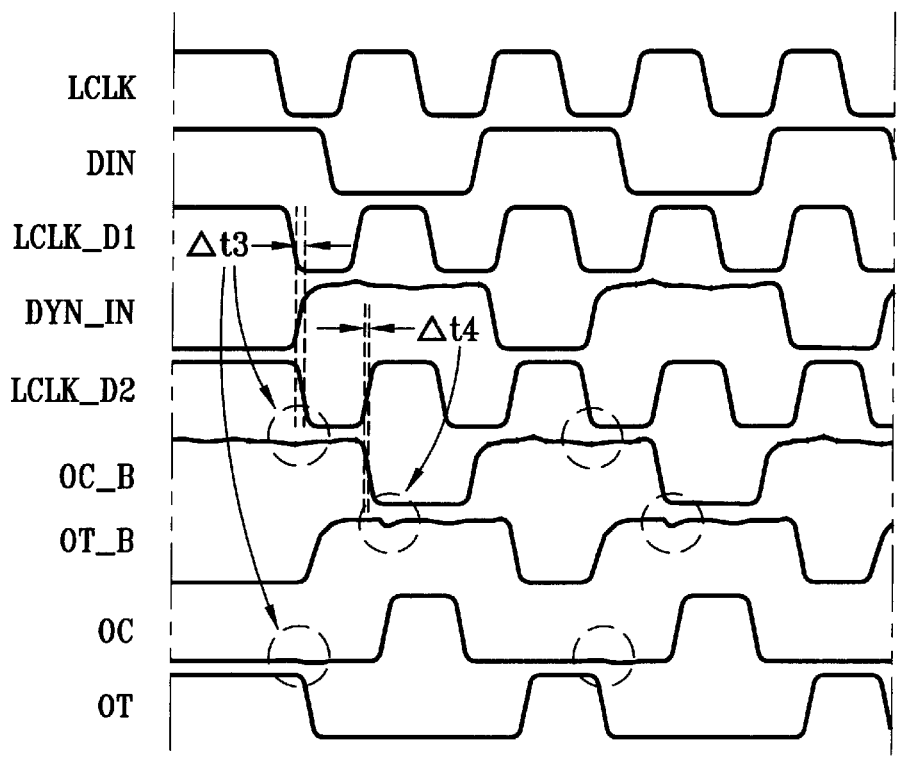
FIG. 4 is a timing diagram illustrating exemplary signal voltages within the phase splitter circuit of FIG. 3 versus time.

FIG. 4 is a timing diagram illustrating exemplary signal voltages within the phase splitter circuit 500 of FIG. 3 versus time. The signal voltages of FIG. 4 were produced via a computer simulation of the phase splitter circuit 500. The input clock signal LCLK and static logic signal DIN were selected to demonstrate certain characteristics of the phase splitter circuit 500.

FIG. 4 shows that the phase splitter circuit 500 of FIG. 3 produces the dynamic logic signals OT and OC at substantially the same time following rising edges of the clock signal LCLK as desired. Also, falling edges of the dynamic logic signal DYN_IN precede rising edges of the clock signal LCLK_D1, produced by delaying the clock signal LCLK, as desired.

FIG. 4 also shows that the glitches in the dynamic logic signals OC_B, OT_B and OC have been substantially reduced over those in FIG. 2. For example, in FIG. 4, the rising edge of the dynamic logic signal DYN_IN precedes the falling edge of the clock signal LCLK_D1 by a time period Δt3, where the time period Δt3 is much smaller than the corresponding time period Δt1 in FIG. 2. As a result, the relatively large glitch in the dynamic logic signal OC_B in FIG. 2 has been substantially reduced in FIG. 4. Further, the corresponding glitch in the dynamic logic signal OC, more apparent in FIG. 2, is almost unnoticeable in FIG. 4. In addition, the rising edge of the clock signal LCLK_D2 precedes the falling edge of the dynamic logic signal OC_B by a time period Δt4 in FIG. 4, where the time period Δt4 is much smaller than the corresponding time period Δt2 in FIG. 2. As a result, the corresponding perturbation in the dynamic logic signal OT_B, clearly evident in FIG. 2, is substantially reduced in FIG. 4. It is noted that the phase splitter circuit 500 of FIG. 3 can be configured to eliminate the time periods Δt3 and Δt4 in FIG. 4.

By virtue of producing signals with glitches of reduced magnitude, the phase splitter circuit 500 of FIG. 5 generates less noise than the phase splitter circuit 100, and is less likely to be a cause of logic errors due to noise than the phase splitter circuit 100. As a result, the phase splitter circuit 500 of FIG. 5 is more desirable than the phase splitter circuit 100 of FIG. 1.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A phase splitter circuit, comprising:
 a clock delay section adapted to receive a clock signal and configured to produce a first delayed clock signal and a second delayed clock signal, wherein the first and second delayed clock signals are time delayed versions of the received clock signal, and wherein the second delayed clock signal is delayed in time to a greater extent than the first delayed clock signal;
 a signal converter section adapted to receive a static logic signal, the clock signal, and the first delayed clock signal, and configured to convert the static logic signal to a dynamic logic signal dependent upon the clock signal and the first delayed clock signal; and
 a signal generator section adapted to receive the dynamic logic signal, the first delayed clock signal, and the second delayed clock signal, and configured to produce a pair of complementary dynamic logic output signals dependent upon the dynamic logic signal, the first delayed clock signal, and the second delayed clock signal, wherein one of the complementary dynamic logic output signals has a logic value equal to that of the static logic signal during an evaluation phase of the clock signal.

2. The phase splitter circuit as recited in claim 1, wherein the static logic signal is produced by a static logic gate.

3. The phase splitter circuit as recited in claim 2, wherein the static logic signal is produced at a node driven by a static logic gate, and the static logic gate forms a low resistance path between the node and one of two power supply voltage levels at all times during operation.

4. The phase splitter circuit as recited in claim 1, wherein the clock signal cycles between a high voltage range and a low voltage range, and wherein the evaluation phase of the clock signal occurs when the clock signal is in the high voltage range.

5. The phase splitter circuit as recited in claim 4, wherein the signal generator section produces the complementary dynamic logic output signals such that the complementary dynamic logic output signals are valid at substantially the same time during each evaluation phase of the clock signal.

6. The phase splitter circuit as recited in claim 1, wherein the dynamic logic signal has a logic value equal to that of the static logic signal during the evaluation phase of the clock signal.

7. The phase splitter circuit as recited in claim 1, wherein the dynamic logic signal is produced at a dynamic node of the signal converter section.

8. The phase splitter circuit as recited in claim 7, wherein the dynamic node is precharged dependent upon the clock signal and the first delayed clock signal.

9. The phase splitter circuit as recited in claim 1, wherein the complementary dynamic logic output signals are logical complements of one another during the evaluation phase of the clock signal.

10. The phase splitter circuit as recited in claim 1, wherein the complementary dynamic logic output signals have voltage values within a low voltage range during a precharge phase of the clock signal.

11. The phase splitter circuit as recited in claim 1, wherein the signal generator section comprises a first dynamic inverter latch configured to evaluate the dynamic logic signal, and wherein the first dynamic inverter latch is controlled by the first delayed clock signal.

12. The phase splitter circuit as recited in claim 11, wherein the signal generator section further comprises a dynamic node driven by the first dynamic inverter latch, and wherein an intermediate dynamic logic signal is produced at the dynamic node.

13. The phase splitter circuit as recited in claim 12, wherein the signal generator section further comprises a second dynamic inverter latch configured to evaluate the intermediate dynamic logic signal, and wherein the second dynamic inverter latch is controlled by the second delayed clock signal.

14. A method for generating a pair of complementary dynamic logic signals from a static logic signal, comprising:

using a clock signal to produce a first delayed clock signal and a second delayed clock signal, wherein the first and second delayed clock signals are time delayed versions of the received clock signal, and wherein the second delayed clock signal is delayed in time to a greater extent than the first delayed clock signal;

using the clock signal and the first delayed clock signal to convert the static logic signal to a dynamic logic signal; and using the dynamic logic signal, the first delayed clock signal, and the second delayed clock signal to produce the pair of complementary dynamic logic signals, wherein one of the complementary dynamic logic signals has a logic value equal to that of the static logic signal during an evaluation phase of the clock signal.

15. The method as recited in claim 14, wherein the using the clock signal and the first delayed clock signal to convert the static logic signal to the dynamic logic signal comprises:

precharging a dynamic node at which the dynamic logic signal is produced dependent upon the clock signal and the first delayed clock signal.

16. The method as recited in claim 14, wherein the using the dynamic logic signal, the first delayed clock signal, and the second delayed clock signal to produce the pair of complementary dynamic logic signals comprises:

using the first delayed clock signal to evaluate the dynamic logic signal, thereby producing a first intermediate dynamic logic signal at a first dynamic node;

using the second delayed clock signal to evaluate the intermediate dynamic logic signal, thereby producing a second intermediate dynamic logic signal at a second dynamic node;

using the first intermediate dynamic logic signal to produce the one of the complementary dynamic logic signals; and using the second intermediate dynamic logic signal to produce the other complementary dynamic logic signal.

17. A phase splitter circuit, comprising:

clock delay means for using a clock signal so produce a first delayed clock signal and a second delayed clock signal, wherein the first and second delayed clock signals are time delayed versions of the received clock signal, and wherein the second delayed clock signal is delayed in time to a greater extent than the first delayed clock signal;

signal converter means for using the clock signal and the first delayed clock signal to convert a static logic signal to a dynamic logic signal; and signal generator means for using the dynamic logic signal, the first delayed clock signal, and the second delayed clock signal to produce a pair of complementary dynamic logic signals, wherein one of the complementary dynamic logic signals has a logic value equal to that of the static logic signal during an evaluation phase of the clock signal.

18. The phase splitter circuit as recited in claim 17, wherein the signal converter means comprises a dynamic node at which the dynamic logic signal is produced, and is configured to precharge the dynamic node dependent upon the clock signal and the first delayed clock signal.

19. The phase splitter circuit as recited in claim 17, wherein the signal generator means comprises a first dynamic node, and wherein the signal generator means is configured to use the first delayed clock signal to evaluate the dynamic logic signal, thereby producing a first intermediate dynamic logic signal at the first dynamic node.

20. The phase splitter circuit as recited in claim 19, wherein the signal generator means comprises a second dynamic node, and wherein the signal generator means is configured to use the second delayed clock signal to evaluate the intermediate dynamic logic signal, thereby producing a second intermediate dynamic logic signal at the second dynamic node.

21. The phase splitter circuit as recited in claim 20, wherein the signal generator means is configured to use the first intermediate dynamic logic signal to produce the one of the complementary dynamic logic signals, and to use the second intermediate dynamic logic signal to produce the other complementary dynamic logic signal.

* * * * *

UNITED STATES PATENT AND TRADEMARK OFFICE
CERTIFICATE OF CORRECTION

PATENT NO.    : 6,664,836 B1
DATED         : December 16, 2003
INVENTOR(S)   : Wen It is certified that error appears in the above-identified patent and that said Letters Patent is hereby corrected as shown below:

<u>Column 13,</u>
Line 38, after "wherein" delete "the".

Signed and Sealed this

Twenty-ninth Day of June, 2004

JON W. DUDAS
*Acting Director of the United States Patent and Trademark Office*